United States Patent
Bierer

(10) Patent No.: US 9,429,597 B1
(45) Date of Patent: Aug. 30, 2016

(54) PHASING VOLTMETER USING CAPACITIVE REACTANCE

(71) Applicant: Walter S. Bierer, Blythewood, SC (US)

(72) Inventor: Walter S. Bierer, Blythewood, SC (US)

(*) Notice: Subject to any disclaimer, the term of this patent is extended or adjusted under 35 U.S.C. 154(b) by 45 days.

(21) Appl. No.: 14/612,612

(22) Filed: Feb. 3, 2015

(51) Int. Cl.
  *G01R 19/00* (2006.01)
  *G01R 1/30* (2006.01)
  *G01R 1/20* (2006.01)
  *G01R 25/00* (2006.01)

(52) U.S. Cl.
  CPC .......... *G01R 19/0084* (2013.01); *G01R 1/203* (2013.01); *G01R 1/30* (2013.01); *G01R 25/00* (2013.01)

(58) Field of Classification Search
  None
  See application file for complete search history.

(56) References Cited

U.S. PATENT DOCUMENTS

| | | |
|---|---|---|
| 6,459,252 B1 | 10/2002 | Bierer |
| 6,617,840 B2 | 9/2003 | Bierer |
| 6,734,658 B1 | 5/2004 | Bierer |
| 7,109,699 B1 | 9/2006 | Bierer |
| 7,808,228 B1 | 10/2010 | Bierer |
| 8,283,911 B1 | 10/2012 | Bierer |
| 8,760,150 B1 | 6/2014 | Bierer |
| 8,970,204 B1 | 3/2015 | Bierer |

*Primary Examiner* — Clayton E Laballe
*Assistant Examiner* — Jas Sanghera
(74) *Attorney, Agent, or Firm* — Michael A. Mann; Nexsen Pruet, LLC

(57) ABSTRACT

A phasing voltmeter having a dual input AC voltage measuring device in parallel with a series configuration of two high impedance high voltage resistors and two metering resistors. Shielding surrounds and isolates the voltmeter and is connected to the series configuration at a junction between the two metering resistors. The AC voltage measuring device measures the voltage across two voltage lines as well as the exact values of the stray AC capacitive charging currents associated with all high voltage sources. From these previously undesirable stray capacitive charging currents, a math processor in the voltmeter and in contact with two dual input measuring device receives input from between each resistor in the series, determines and displays the actual voltage across the conductors, its origin, the leading phase, lagging phase, phase sequence and phase rotation of the voltages on the AC conductors undergoing testing.

12 Claims, 8 Drawing Sheets

PHASING VOLTMETER USING CAPACITIVE REACTANCE

BACKGROUND OF THE INVENTION

Electricity transmitted through power lines destined for commercial, industrial and residential use can involve hundreds of thousands of volts and high currents. To measure the voltage, the utility worker must contact a high voltage line, which presents a significant risk to the worker. Indeed, mere proximity to a high voltage line is extremely dangerous. Nonetheless, in installing, servicing and repairing power lines, measurements of the voltage and phasing parameters such as the phase sequence or rotation must be made.

The circumstances and equipment used for measuring voltage and phase sequence of transmission lines vary considerably. For example, prior art phasing voltmeters with long interconnect cords are customarily used for measuring the voltage on individual lines of a multi-phase transmission power lines. This corded phasing volt meter helps to prevent two lines that are not in phase from being connected inadvertently. When other parameters of the AC voltage, such as the phase sequence or rotation of the voltage on the conductors, are to be determined, a completely different instrument or a whole set of instruments and additional equipment costing many thousands of dollars must be used.

However, if a prior art type phasing voltmeter such as the one described in U.S. Pat. No. 6,459,252 were improved as described herein, it could be used to measure voltage parameters such as leading phase, lagging phase, voltage phase sequence and phase rotation when a voltage measurement is taken and thereby minimize the number of times the worker approaches or contacts a high voltage line to reduce the risk to the worker and eliminate additional equipment, thus avoiding injuries and saving thousands of dollars in expenses.

There are four well-known, distinctly different voltage measurements that may be made on a three-phase power line. The present voltmeter is capable of all four and adds a fifth voltage measurement, heretofore never mentioned. This fifth measurement accurately determines the magnitude of a source of measurement inaccuracy among high voltage phasing meters when making the four standard measurements mentioned above.

Historically, high voltage measurements made using a corded type high voltage phasing meter have been plagued with inaccuracies stemming from stray capacitive charging currents. At high voltages, stray charging currents emanate from the surface of every component of the measuring device including the cord itself. The capacitive current is related to the capacitive reactance, Xc, which can range from several thousand ohms up to millions of ohms, depending on the location of the meter and its cable with respect to ground or grounded objects. Under extreme conditions, such as when a long series cable of a corded phasing volt meter is lying directly on the ground between two pad-mounted transformers, the value of the capacitive reactance can be very low resulting in a capacitive current that can equal or exceed the measured current.

While at least one prior art phasing voltmeter is able to reconcile the stray AC capacitive charging currents to provide accurate voltage indications under all conditions, even it fails to recognize, analyze and extract the valuable information contained in the charging current. There remains a need for an improved phasing voltmeter that has the ability to measure and analyze the stray AC capacitive charging current in order to provide additional voltage-related information to the user based on a single contact with the high voltage line.

SUMMARY OF THE INVENTION

According to its major aspects and briefly recited, the present invention is a phasing voltmeter that determines the origin of the capacitive currents, measures and analyzes them to provide to the operator of the voltmeter the actual voltage, the source of the voltage, the leading phase, the lagging phase, the phase sequence, and the rotation of the voltages on the conductors undergoing testing.

The present phasing voltmeter includes a pair of high impedance resistors in an electrical series with a cable and two low impedance resistors. This series is connected electrically at a single point of contact to the meter's electrical shielding, similar to that of the prior art phasing voltmeter cited above. However, unlike circuits of the prior art voltmeter, the present voltmeter has a dual input AC voltage measuring device wherein each input is connected in parallel with one of the of the two low impedance metering resistors.

By using this arrangement, the present voltmeter sets up three current paths in three different voltage divider networks which enables it to measure (1) the desired metering current representing the applied input voltage, (2) the previously undesirable stray capacitive charging current originating from a first source voltage or ground, and (3) the previously undesirable stray capacitive charging current originating from second source voltage or ground. The magnitudes, origins, and phases of the stray capacitive charging currents in the present invention are now known and are used to calculate an accurate line voltage and to indicate the source of the voltage, the leading phase, the lagging phase, the phase sequence, and the phase rotation or ground.

These and other features and their advantages will be apparent to those skilled in the art of transmission line voltage measurement from a careful reading of the Detailed Description of Preferred Embodiments accompanied by the following drawings.

BRIEF DESCRIPTION OF THE DRAWINGS

In the figures.

DETAILED DESCRIPTION OF THE PREFERRED EMBODIMENT

Figure 1:
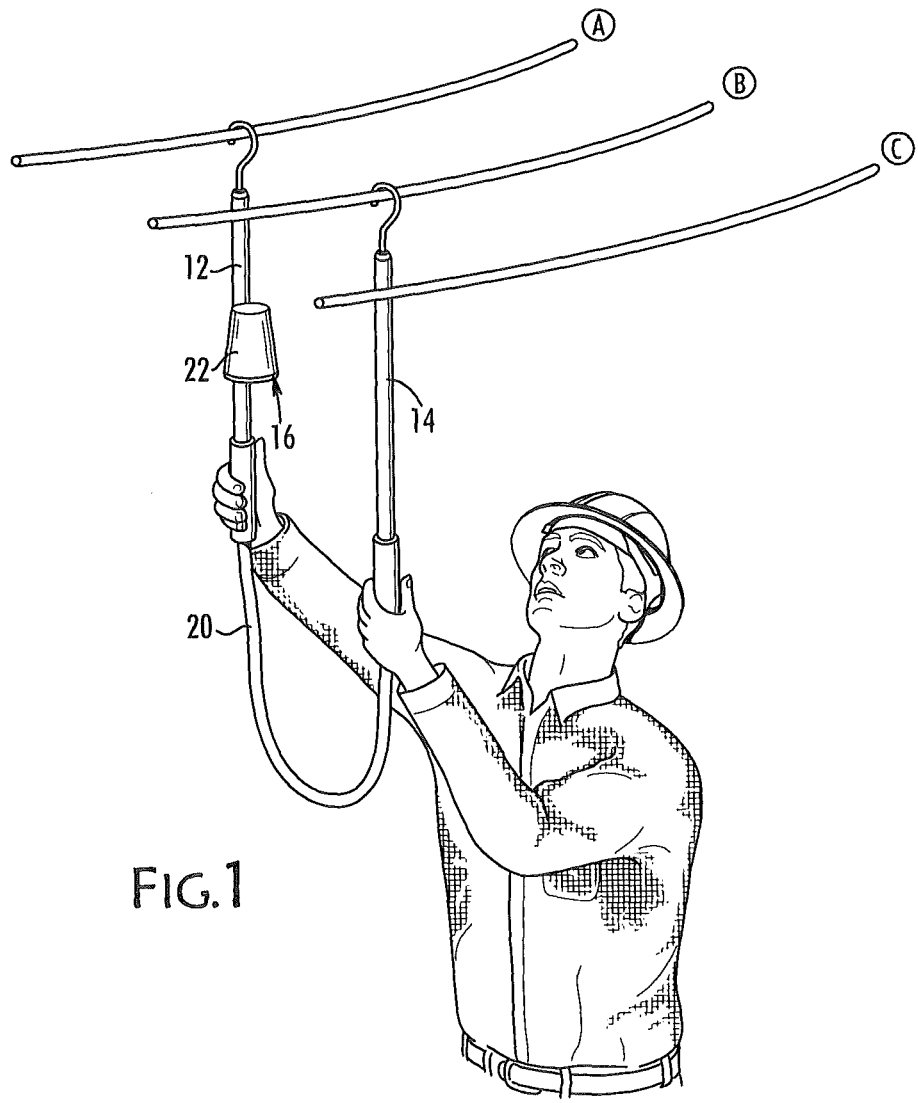
FIG. 1 illustrates the use of a phasing voltmeter by a utility worker.

The present invention is a phasing voltmeter that is an improvement over prior art phasing voltmeters. Externally, and to a significant extent internally, the present phasing voltmeter has features similar to the prior art voltmeter of U.S. Pat. No. 6,459,252 and operates in much the same way. FIG. 1 illustrates a high voltage phasing meter 16 such as that of U.S. Pat. No. 6,459,252 in use by a utility worker. The present meter is used in the same way.

The overhead lines designated A, B, and C represent electrical power lines carrying alternating current. Each line is 120 degrees out of phase with the other two lines. Voltage transmission lines are of course not part of the present invention. The measurement of the voltage is shown in FIG. 1 as being made across the A and B lines rather than, say, the A and C lines for convenience only.

Presently, and as illustrated in FIG. 1, high voltage phasing voltmeters use two insulated, high voltage resistors in probes 12 and 14 in series with each other and with the meter 16 and a cable 20. Probes 12, 14, have metal hooks or other fittings on their ends for making electrical contact with transmission lines quickly and easily. Meter 16 may be mounted to one of the two insulated probes, such as probe 12 as seen in FIG. 1, and oriented so that the electric utility worker can read the voltage displayed on meter 16 from below. "Hot sticks" (not shown) may be used to extend probes 12, 14, so that the entire assembly can be held aloft. Meter 16 may be designed to measure either voltage or current, but its display indicates voltage.

Figure 2A:
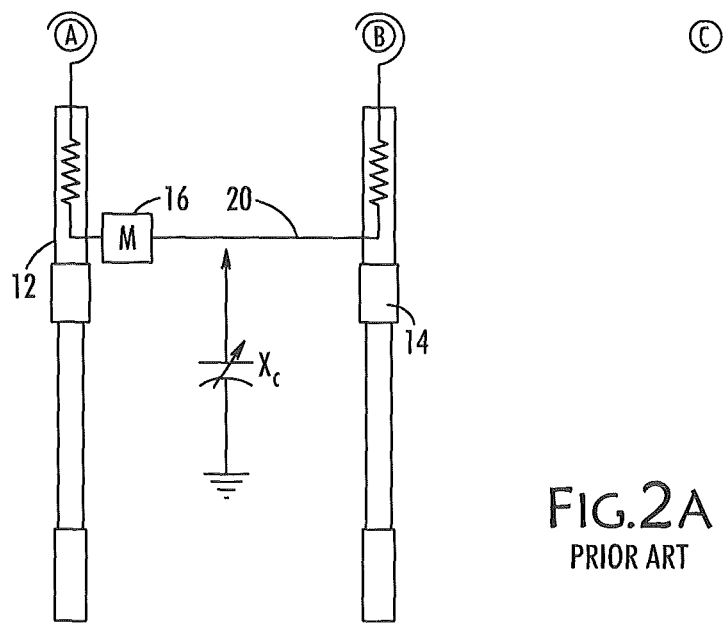
FIGS. 2A-2D illustrates the four basic types of measurements for which a phasing voltmeter may be used.
Figure 2B:
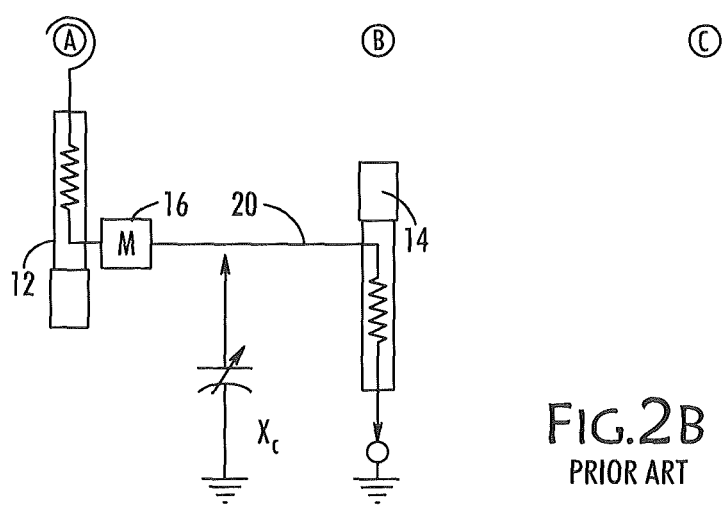
Figure 2C:
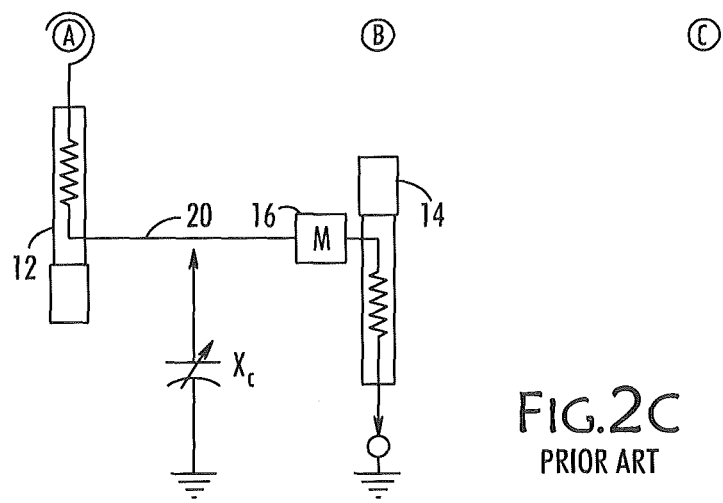
Figure 2D:
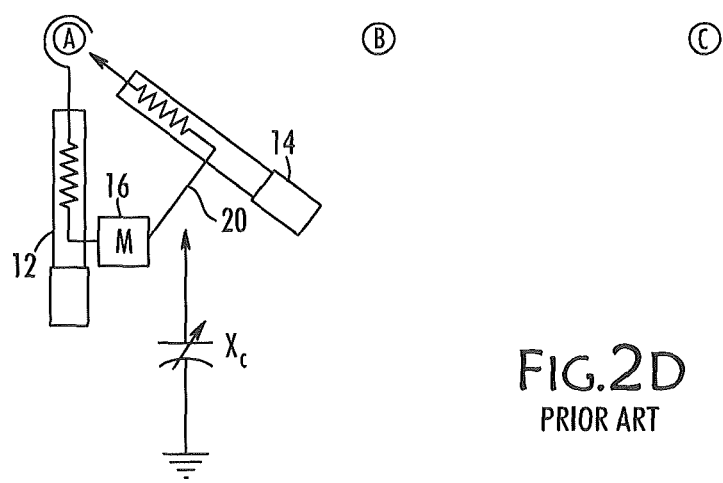

Referring now to FIGS. 2A, 2B, 2C and 2D, each of which illustrates one of four different voltage measurements that may be made on a three-phase power line. They are: phase to phase (FIG. 2A), phase to ground (FIG. 2B), ground to phase (FIG. 2C), and a "zero reference" test (FIG. 2D). This last measurement should indicate very nearly zero volts when measuring the voltage difference between two conductors of the same phase and the voltage between two electrical connections on the same conductor.

Figure 3:
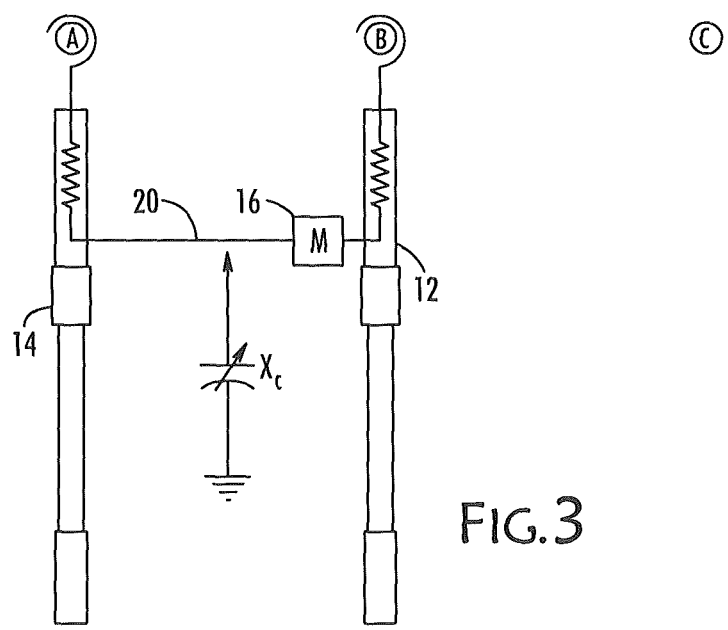
FIG. 3 illustrates a fifth measurement that the present phasing voltmeter may make in combination with those of FIGS. 2A-2D.

Referring now to FIG. 3, the present invention illustrates a fifth voltage measurement that is the reverse of that illustrated in FIG. 2A. It is generally assumed that reversing the probes provides no new information. Of course, neither the phase A to phase B voltage measurement as shown in FIG. 2A nor its reverse as shown in FIG. 3, do not define a direction. However, when the leads are reversed, however, prior art phasing meters respond differently to B phase to A phase voltage measurements than the A phase to B phase voltage measurement. Unlike prior art phasing voltmeters, the present voltmeter includes circuitry to measure that response difference and, moreover, to extract information from it that enables the present phasing voltage meter to display the source of voltage, leading phase, lagging phase, phase sequence and phase rotation of the voltage on the conductors each time a voltage measurement is taken.

Figure 4:
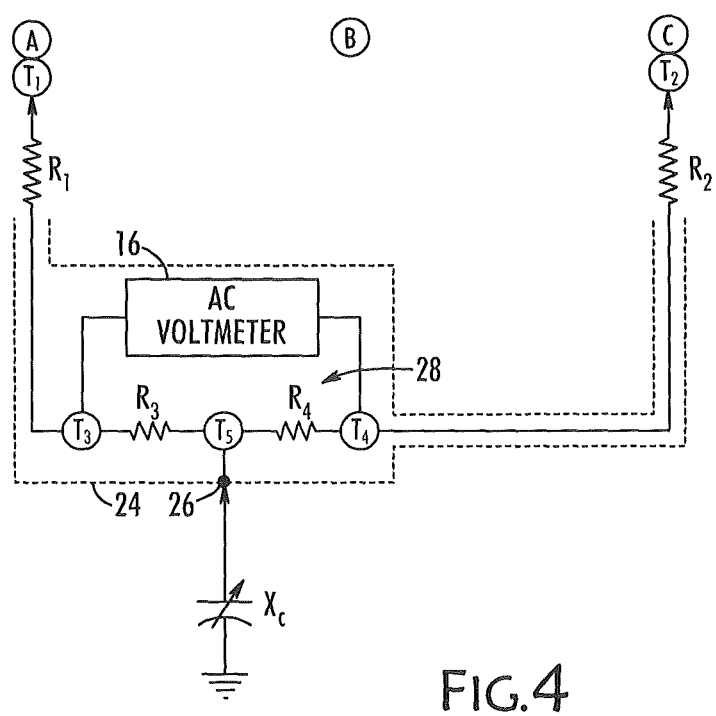
FIG. 4 illustrates schematically a prior art phasing voltmeter.

Referring now to FIG. 4, which shows schematically a prior art high voltage phasing meter 16 such as that taught by U.S. Pat. No. 6,459,252. Prior art meter 16 removes the inaccuracies of the voltage readings stemming from stray AC capacitive charging currents when used to measure voltage, as shown in FIG. 2A for example.

Voltmeter 16 has a first probe 12 is shown in contact with the A line; a second probe 14 is shown in contact with the C line. First probe 12 includes a resistor R1; second probe 14 includes a resistor R2.

Between first and second probes 12 and 14, and electrically in series with them, is a cable 20 and two metering resistors R3 and R4.

Electrical shielding 24 is electrically continuous and extends from first and second probes 12, 14, to cable 20, and to other non-ferrous parts of voltmeter 16.

Shielding 24, because it extends over substantially the whole of phasing voltmeter 16, assures that the capacitive reactance, $X_c$, between the ground and every part of phasing voltmeter 16 is the same, which is important because of the location-specific nature of capacitive reactance. Without the continuous shielding, the capacitive reactance would vary depending on the physical relationship between each separately shielded part of phasing voltmeter 16 and ground, but wherever phasing voltmeter 16 is, $X_c$ will be the same throughout shielding 24.

In FIG. 4, meter 16 is shown measuring voltage across the A phase power source at electrical connection T1 and the C phase power source at electrical connection T2. FIG. 4 shows probe resistors R1 and R2 and meter resistors R3 and R4 in a four-resistor series. Cable 20 connects R2 to AC meter 16 and R1. Shielding 24 surrounds and isolates cable 20, probes 12, 14 and meter 16 as well as resistors 3 and 4. Shielding 24 ties to a common electrical connection 26 between meter resistors R3 and R4. Voltmeter 16 may then read the voltage across electrical connections T3 and T4 without the impact of $X_c$. By tying the shielding to the common electrical connection 26, the voltage across the meter remains the same for all values of $X_c$ resulting from capacitive currents.

Figure 5:
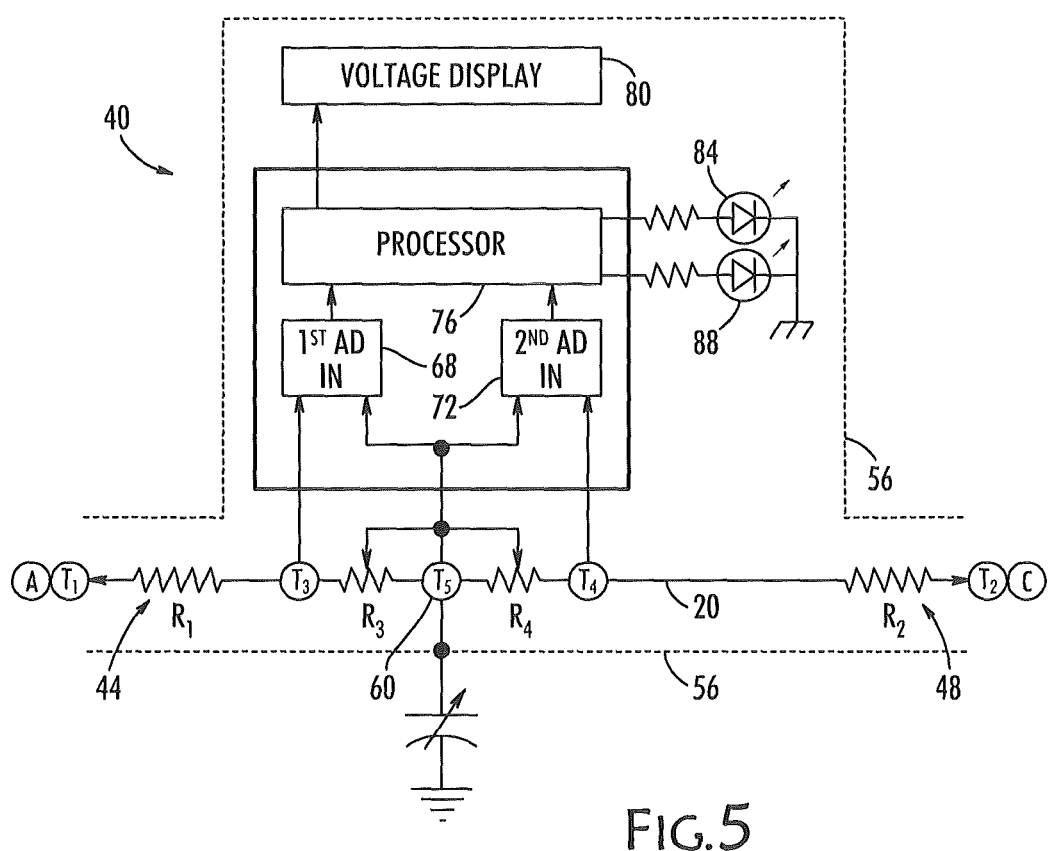
FIG. 5 illustrates the present phasing voltmeter schematically, according to a preferred embodiment of the present invention.

Turning now to the present voltmeter 40, illustrated schematically in FIG. 5, the improved meter 40 is shown measuring the voltage across power sources A and C. Meter 40 includes two probes 44, 48, a cable 20, resistors R1 and R2 that make contact at electrical connections T1 and T2, respectively, with power sources A and C. Ideally, R1 and R2 have large resistances and are matched so that the resistances of R1 and R2 are the same or very close in magnitude. The resistances of R1 and R2 may be tens of millions of ohms, such as, for example, 50,000,000 ohms.

Resistors R1 and R2 should have sufficient resistance to keep the current passing through them very low, on the order of a milliamp or preferably less, such as approximately 0.5 milliamps so as to limit resistive heat. In phasing voltmeter 40, prolonged contact with transmission lines without generating appreciable resistive heat by either the probe resistors R1 and R2 or the components of voltmeter 40 is important as resistive heat adversely affects the accuracy of voltage measurements.

Meter 40 also has two metering resistors R3 and R4 in series with and between resistors R1 and R2, to form a four-resistor series R1, R3, R4, and R2. Voltmeter 40 also has shielding 56 surrounding its components including probe resistors R1 and R2, metering resisters R3 and R4, and cable 52. Metering resistors R3 and R4 should also be matched to each other, that is, having the same or very nearly the same resistance.

Shielding 56 is electrically isolated from resistors R1 and R2 of probes 44, 48, as well as the electrical conductor in cable 20, the electronics of meter 40, and resistors R3 and R4 except for an electrical connection at common point 60. Metering resistors R3 and R4 may be adjustable resistors for calibration.

Voltmeter 40 has electrical connections T3, between R1 and R3, and T4, between R4 and R2, from which to measure the voltage across source A and source C or perform any of the measurements shown in FIGS. 2A-2D or FIG. 3. An electrical contact point T5 is provided between R3 and R4 which coincide with common point 60. In the present specification including claims, a power source may be used to mean an electrical power line or ground or any potential source of electrical power.

Unlike the present voltmeter 40, prior art meter 16 has but one connection from T3 and one connection from T4 for measuring voltage differences. In FIG. 5, by contrast, meter 40 has a processor 76 that receives digital input from a first and second, dual input, analog-to-digital converter 68, 72. Converters 68, 72 receive analog inputs from T3, T4, and T5 and provide digital signals to processor 76 for three voltage measurements: T3-T4, T3-T5, and T5-T4.

Phasing voltmeter 40, as described, thus has three precision voltage divider networks. The first of these three precision voltage divider networks divides the voltage between transmission sources A and C (or other voltage source or ground) across the inputs from resistor R1 and resistor R2 by an exact amount (such as a factor of 1,000, 000) and provides two precise voltages, one to first converter 68 from T3 and one to second converter 72 from T4.

The second of the precision voltage divider networks divides the voltage between transmission line A measured at T3 and shielding 56 at T5. R3 serves as the metering resistor in this second voltage divider network and supplies a complex voltage waveform to the first input to first converter 68. The current in this voltage divider network represents the desired metering current plus the charging current supplied from transmission source A.

Finally, the third precision voltage divider network divides the voltage between transmission line C measured at T4 and T5. Resistor R4 serves as the metering resistor in this third voltage divider network and supplies a complex voltage waveform to the second input of second converter 72. The current in this voltage divider network represents the desired metering current plus the charging current supplied from transmission source C.

Processor 76 receives the two complex voltage waveforms from the output of dual converters 68, 72, and processes voltage and phase angle information to calculate and display accurate voltage indications on display 80.

Optionally or in addition to indicating voltages on display 80, a first and a second light-emitting diode, or LED 84, 88, may be used to indicate results. Each of first and second LEDs 84, 88 may be capable of red, green and yellow light. First LED 84 may correspond to the power source with which first probe 44 is in contact, and second LED 88 may correspond to the power source with which probe 48 is in contact. On a single-phase, two-conductor AC electric system, a red indication on first LED 84 and green indication on second LED 88 can be used to indicate the source of voltage is on first probe 44 and ground is on second probe 48. A reverse of these colors would of course indicate a reverse of the voltage source and ground on first and second probes 44, 48, respectively.

On a standard three-phase AC electric system with a fourth ground conductor, the red/yellow/green first and second LEDs 84 and 88 can be used to indicate which conductor is the leading phase and which conductor is the lagging phase. A red indication on first LED 84 and yellow indication on second LED 88 indicates the leading phase is represented on first probe 44 and the lagging phase is represented on second probe 48.

First and second LEDs 84, 88, may also be set up to indicate and identify phase sequence or phase rotation by color.

Figure 6:
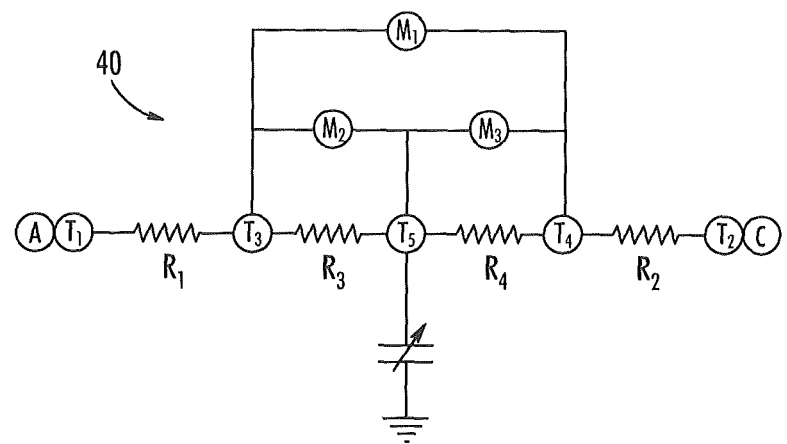
FIG. 6 is an alternate schematic illustration of the present voltmeter showing the three measurements taken by meters M1, M2 and M3, according to an embodiment of the invention.

FIG. 6 is an alternative schematic of voltmeter 40 in which M1, M2, and M3 are shown instead of dual input A/D converters 68, 72, and processor 76. M1 measures the voltage across T3 and T4, M2 measures the voltage across T2 and T5, and M3 measures the voltage across T5 and T4.

Figure 7:
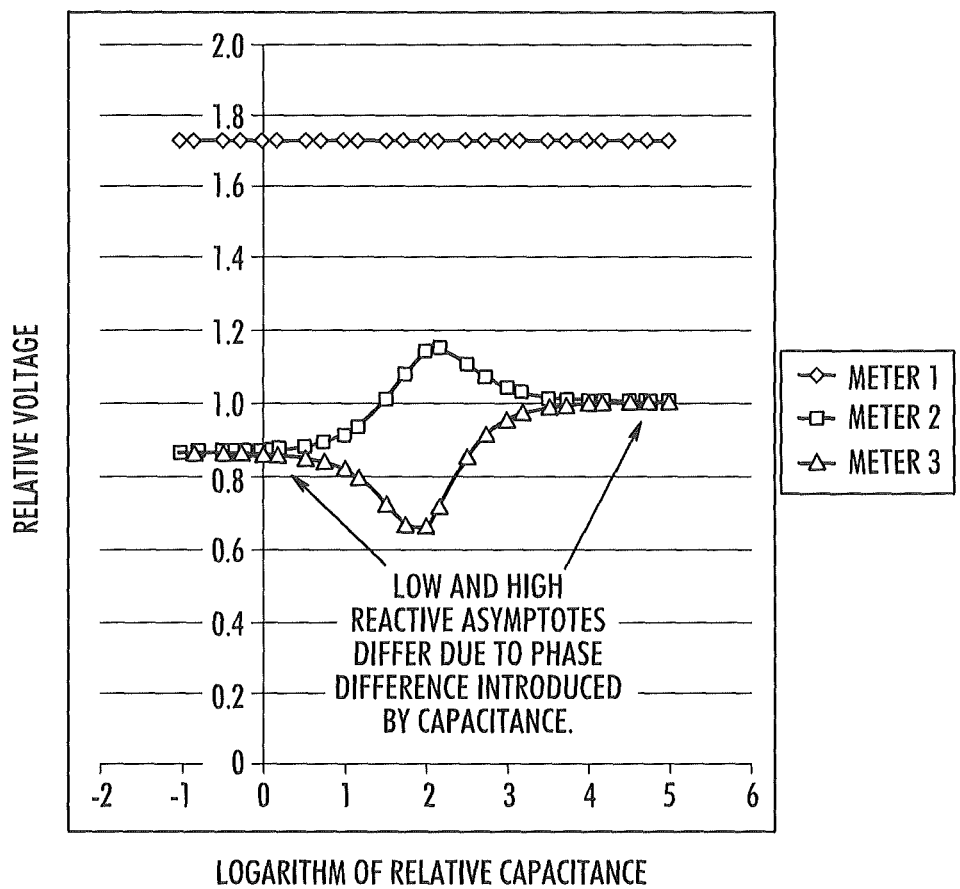
FIG. 7 is a graph illustrating the asymmetrical relationship between the voltage drops across metering resistors R3 and R4 in the present invention when measuring voltages across phases A to B and phases B to A.

FIG. 7 is a graphic representation of an example of voltages measured by M1, M2 and M3 over a range of $X_c$ ranging from very near zero to infinity. The graph in FIG. 7 demonstrates that the voltages for M2 and M3 are asymmetrical and that the leading phase provides the largest share of the stray AC capacitive charging current(s). This graph also contrasts the difference in magnitude of the voltage indications from M1 at the top of the graph as would also be determined by the prior art meter of FIG. 4, with the voltages measured by M2 and M3 by the voltmeter of FIGS. 5 and 6, according to the present invention. The two additional voltages measured by M2 and M3 provide complete information about phase from the reactive capacitance.

Accordingly by placing first and second probes 44, 48, of meter 40 in contact with two power sources, not only will the user be able to accurately make all five measurements of FIGS. 2A-2D and FIG. 3, but will also determine the origin of the voltage, the leading phase, lagging phase, phase sequence and the phase rotation of the voltages on the conductors at the same time. Additional equipment will not be needed and additional contacts with the power lines are avoided.

Those skilled in the art of voltage measurement, particularly high voltage measurement will appreciate that substitutions and modification may be made in the specific design of the voltmeter described herein, such as in the magnitudes of the probe resistances and meter resistances, without departing from the spirit and scope of the present invention, which is defined by the appended claims.

What is claimed is:
1. A voltmeter for indicating voltage and phase difference between two power lines, said voltmeter comprising:
   (a) a first probe having a first resistor with a resistance;
   (b) a second probe having a second resistor, said second resistor being in electrical series with said first resistor and having a resistance matched to said resistance of said first resistor;
   (c) a first and a second metering resistor in an electrical series with each other and with and between said first and second resistors, said first metering resistor having a resistance and said second metering resistor having a resistance matched to said resistance of said first metering resistor;
   (d) shielding surrounding said first and second probes and said first and second metering resistors, said shielding being in electrical contact with said electrical series;
   (e) a meter being in electrical connection with said electrical series and having
      (i) a first electrical connection between said first resistor of said first probe and said first metering resistor, said first electrical connection having a first electrical input to said meter,
      (ii) a second electrical connection between said second metering resistor and said second resistor of said second probe, said second electrical connection having a second electrical input into said meter, and
      (iii) a third electrical connection between said first and said second metering resistors, said third electrical connection having a third electrical input to said meter, wherein said meter receives said first, second and third electrical inputs, determines differences in

(i) said first electrical input and said second electrical input,
(ii) said first electrical input and said third electrical input, and
(iii) said third electrical input and said second electrical input, and produces outputs proportional to said differences, so that, when said first probe contacts a first power source and said second probe contacts a second power source, said meter produces said outputs.

2. The voltmeter of claim 1, further comprising a display connected to said meter, said meter producing an output received by said display, said display displaying said output.

3. The voltmeter as recited in claim 1, wherein said shielding is electrically connected to said series at said electrical connection of said third input.

4. The voltmeter as recited in claim 1, wherein said meter further comprises:
(a) a processor;
(b) a first analog-to-digital converter; and
(a) a second analog-to-digital converter, wherein said first analog-to-digital converter receives said first input and third input and said second analog-to-digital converter receives said second input and said third input, said first and second analog-to-digital converters generating digital signals equivalent to said first, second, and third electrical inputs and forwarding said digital signals to said processor, said processor calculating voltages across said first input and said second input, across said first input and said third input, and across said third input and said second input.

5. The voltmeter of claim 4, further comprising a display connected to said processor, said display receiving an output from said processor and displaying said voltages.

6. The voltmeter of claim 5, wherein said display comprises a first light emitting diode and a second light emitting diode and wherein said first and second light-emitting diodes light to indicate phase difference and phase sequence.

7. The voltmeter of claim 6, wherein said first and second light emitting diodes are configured to emit in at least one color selected from the group of red, green and yellow.

8. The voltmeter of claim 4, wherein the resistances of first and second resistors is sufficient to keep the current passing through them to less than 1 milliamp.

9. The voltmeter of claim 4, wherein first and second metering resistors are adjustable resistors.

10. A method of using a voltmeter according to claim 5, wherein said method comprises the steps of:
(a) contacting a first power source with said first probe;
(b) contacting a second power source with said second probe;
(c) calculating with said processor the voltage across said first electrical input and said second electrical input; and
(d) displaying said voltage on said display.

11. The method of claim 10, wherein said voltmeter further comprises the step of determining said phase difference between said first power source and said second power source by
(a) calculating the voltages across said first electrical input and said third electrical input and said third electrical input and said second electrical input; and
(b) displaying said phase difference on said display.

12. The method of claim 10, wherein said display includes a first light emitting diode and a second light emitting diode, said first light emitting diode corresponding to said first probe and said second light emitting diode corresponding to said second probe and wherein said method further comprising the steps of:
(a) applying said first probe to a first power source and applying said second probe to a second power source;
(b) lighting said first diode in a first color if said first probe is in contact with a leading phase and in a second color if said first probe is in contact with a lagging phase, while
(c) lighting said second diode in said first color if said second probe is in contact with said leading phase and in said second color if said second probe is in contact with a lagging phase.

* * * * *